United States Patent
Sporer et al.

(10) Patent No.: US 9,958,909 B1
(45) Date of Patent: May 1, 2018

(54) ELECTRONIC HOUSING DESIGN AND METHOD OF IMPROVING ELECTROMAGNETIC COMPATIBILITY BY MOUNTING AND FIXATION TECHNOLOGY

(71) Applicant: General Electric Company, Schenectady, NY (US)

(72) Inventors: Bernd Sporer, Augsburg (DE); Klaus Weinmann, Augsburg (DE); Oleg Schneider, Augsburg (DE)

(73) Assignee: General Electric Company, Schenectady, NY (US)

( * ) Notice: Subject to any disclaimer, the term of this patent is extended or adjusted under 35 U.S.C. 154(b) by 0 days. days.

(21) Appl. No.: 15/597,983

(22) Filed: May 17, 2017

(51) Int. Cl.
G06F 1/18 (2006.01)
H01R 4/64 (2006.01)
H01R 4/48 (2006.01)

(52) U.S. Cl.
CPC ............. G06F 1/182 (2013.01); H01R 4/48 (2013.01); H01R 4/64 (2013.01)

(58) Field of Classification Search
None
See application file for complete search history.

(56) References Cited

U.S. PATENT DOCUMENTS

| | | | |
|---|---|---|---|
| 6,542,383 B1 | 4/2003 | Tsuyuki et al. | |
| 7,239,507 B1 | 7/2007 | Kim | |
| 7,733,659 B2 * | 6/2010 | Snider | H04B 1/082 29/830 |
| 8,553,397 B2 * | 10/2013 | Alameh | H04M 1/0254 361/679.01 |
| 9,086,836 B2 * | 7/2015 | Becze | G06F 3/1438 |
| 2001/0010629 A1 | 8/2001 | Cherniski et al. | |
| 2005/0042891 A1 * | 2/2005 | Hein | H01R 4/64 439/61 |
| 2006/0073742 A1 * | 4/2006 | Cisey | H01R 4/48 439/857 |
| 2012/0061529 A1 * | 3/2012 | Hill | H01R 4/48 248/65 |
| 2012/0218211 A1 * | 8/2012 | McRae | G06F 1/1656 345/173 |
| 2012/0309470 A1 * | 12/2012 | Park | G06F 1/1681 455/575.3 |
| 2013/0244506 A1 * | 9/2013 | Endo | H01R 4/48 439/825 |
| 2013/0265696 A1 * | 10/2013 | Smyth | G06F 1/182 361/679.01 |
| 2014/0182923 A1 | 7/2014 | Gerken et al. | |

(Continued)

FOREIGN PATENT DOCUMENTS

WO          9535576          12/1995

OTHER PUBLICATIONS

Multi-Directional Actuated Complaint Emc (Electromagnetic Conduction) Fingers Formed From Selfsame Material Comprising Electronic (Computer) Housing, Jul. 14, 2009, 2 pages. Abstract.

(Continued)

*Primary Examiner* — Xanthia C Cunningham
(74) *Attorney, Agent, or Firm* — Armstrong Teasdale LLP

(57) ABSTRACT

A housing design and method of providing electromagnetic compatibility (EMC) by mitigating a slot antenna in a corner region of a housing, the corner profile including an electrically conductive insert that has a spring bias, such as a spring or coated plastic member, in a corner of the housing.

20 Claims, 14 Drawing Sheets

(56) References Cited

U.S. PATENT DOCUMENTS

| | | |
|---|---|---|
| 2015/0004845 A1 | 1/2015 | Barrefelt et al. |
| 2015/0044918 A1* | 2/2015 | Endo .................. H01R 4/48 |
| | | 439/741 |
| 2015/0189766 A1* | 7/2015 | Fan .................... G06F 1/18 |
| | | 312/223.2 |
| 2016/0060903 A1 | 3/2016 | Russo et al. |
| 2016/0173028 A1* | 6/2016 | Andrews ............. H01R 4/26 |
| | | 136/251 |
| 2016/0252418 A1 | 9/2016 | Schoot Uiterkamp et al. |
| 2016/0270270 A1* | 9/2016 | Madsen ............... H04B 1/08 |

OTHER PUBLICATIONS

U-Channel Gasket for Improved Connector Electro-Magnetic Compatibility Resistance, Mar. 5, 2008, 2 pages. Abstract.

* cited by examiner

DETAIL B

ELECTRONIC HOUSING DESIGN AND METHOD OF IMPROVING ELECTROMAGNETIC COMPATIBILITY BY MOUNTING AND FIXATION TECHNOLOGY

BACKGROUND

Features of the present disclosure relate to electronic devices that use an enclosure or housing, specifically a design and method for improving electromagnetic compatibility (EMC).

Electromagnetic compatibility (EMC) is the branch of electrical engineering concerned with the unintentional generation, propagation and reception of electromagnetic energy that may cause unwanted effects such as electromagnetic interference (EMI). EMI may thus cause physical damage in operational equipment. The damaging effects of EMI pose risks in many areas of technology. EMI can be mitigated to reduce the risk. The goal of EMC is the correct operation of different equipment in a common electromagnetic environment.

EMC issues include the generation of electromagnetic energy, whether deliberate or accidental, by some source and its release into the environment. The field of EMC takes into account the unwanted emissions and provides countermeasures that may be taken in order to reduce unwanted emissions. EMC issues also include the susceptibility of electrical equipment, referred to as the victim, to malfunction or break down in the presence of unwanted emissions, e.g., radio frequency interference (RFI). Immunity is the opposite of susceptibility and is the ability of equipment to function correctly in the presence of RFI. Another issue of EMI is coupling, which is the mechanism by which emitted interference reaches the victim.

Interference mitigation and electromagnetic compatibility may be achieved by addressing any of these issues, i.e., quieting the sources of interference, inhibiting coupling paths and/or hardening the potential victims. In practice, many of the engineering techniques used, such as grounding and shielding, may apply to the issues.

A standard known Industrial Personal Computer (IPC) housing 101 is illustrated in FIG. 1. As illustrated, the housing walls 111 of the IPC are extruded such that the wall structure is unitary, e.g., a closed rectangular cross-section of a single piece. Because the corners and the walls are unitary in the housing of FIG. 1, there is not a significant EMI problem. The downside of such a rectangular extruded housing part is that there is no flexibility to change the dimensions of the housing are fixed. Moreover, such unitary extruded housing can be expensive to build.

Accordingly, a housing design part to archive more competitive cost and allowing more flexibility to change size and shape was developed. The selected way to build that housing part is now corner profiles, which are installed to a base, and sheet metal walls, which slide into slots (recess) in the corner profiles. The sheet metal/corner profile assembly suffers the problem that there is a gap in between the corner profile and the sheet metal walls. This gap becomes a problem because it functions as a slot antenna, which makes it difficult to fulfil the EMC. Depending on the electronic inside, the slot antenna may remain unresolved.

BRIEF SUMMARY OF THE DISCLOSURE

In accordance with the purpose(s) of this disclosure, as embodied and broadly described herein, this disclosure, in one aspect, relates to a housing, comprising a first sidewall; a profile having at least one recess extending there through, wherein a portion of the first sidewall extends into the recess; a second sidewall, wherein the first sidewall is adjacent to the second sidewall; and an insert in the recess and extending in a direction of the recess, a portion of the insert in contact with the profile and the portion of the first sidewall in the recess.

In another aspect, the disclosure relates to a housing, comprising a base; a profile extending from the base and having a slot therein; a wall having an edge in the slot of the profile, wherein at least a portion of the wall is electrically conductive; and an insert having a spring bias in the slot adjacent to the wall, the insert pressing the wall to abut the profile, wherein at least a portion of the profile is electrically conductive.

In yet another aspect, the disclosure relates to a method of dissipating EMI in a housing having at least two sidewalls, comprising providing a profile; sliding the first sidewall into a first slot in the profile; sliding the second sidewall into a second slot in the profile; and providing an insert having a spring bias, the insert in one of the first slot and second slots of the profile to abut at least a portion of one of the first sidewall and second sidewall and an inner surface of the one of the first slot and the second slot to apply a spring force to the one of the first and second sidewalls to press the one of the first sidewall and second sidewall to abut the profile.

Additional features of the disclosure will be set forth in part in the description which follows, and in part will be obvious from the description, or may be learned by practice of the disclosure. The features of the disclosure will be realized and attained by means of the elements and combinations particularly pointed out in the appended claims. It is to be understood that both the foregoing general description and the following detailed description are exemplary and explanatory only and are not restrictive of the disclosure, as claimed.

An advantage of the present disclosure is to provide a modular assembly for an electronic device with EMC.

Further features, and advantages of the electronic housing design, as well as the structure and operation of the various features of the electronic housing design, are described in detail below with reference to the accompanying drawings.

It is to be understood that both the foregoing general description and the following detailed description are exemplary and explanatory only, and are not restrictive of the disclosure as claimed.

BRIEF DESCRIPTION OF THE DRAWINGS

The accompanying figures, which are incorporated herein and form part of the specification, illustrate an electronic housing design and method of improving electromagnetic compatibility. Together with the description, the figures further serve to explain the principles of the electronic housing design and method of improving electromagnetic compatibility described herein and thereby enable a person skilled in the pertinent art to make and use the electronic housing design and method of improving electromagnetic compatibility.

DETAILED DESCRIPTION

Figure 1:
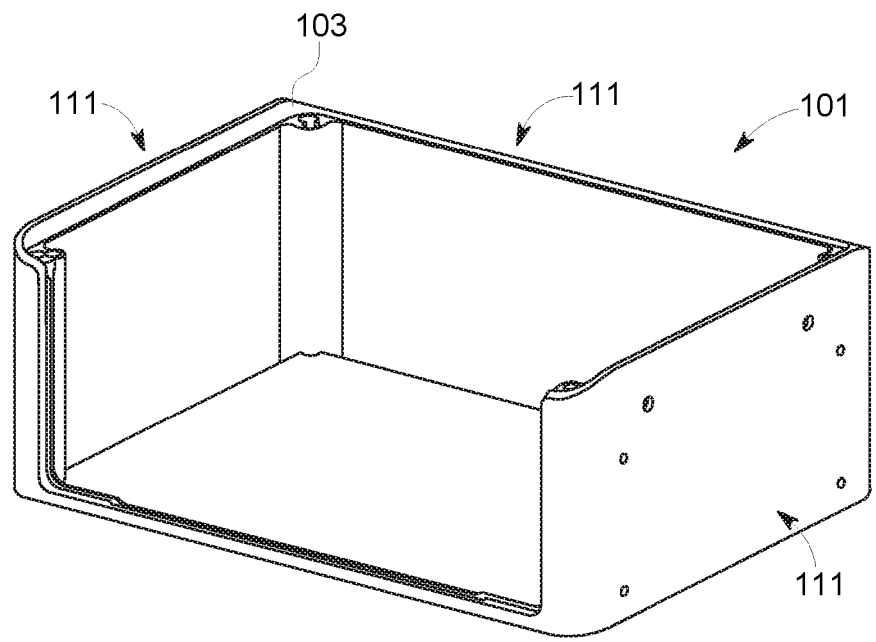
FIG. 1 illustrates an example of an extruded housing part used with an IPC (as an example of a possible implementation)

Reference will now be made in detail to examples of an electronic housing design and method of improving electromagnetic compatibility with reference to the accompanying figures, in which like reference numerals indicate like elements.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

Principles of the present disclosure are applicable, in general, to various electronics that use an enclosure/housing. While illustrated herein for use with an Industrial PC (IPC), the principles of the present disclosure are applicable to products that suffer from or could be damaged by EMI and use an enclosure to protect the electronic against influences from the environment.

Figure 2:
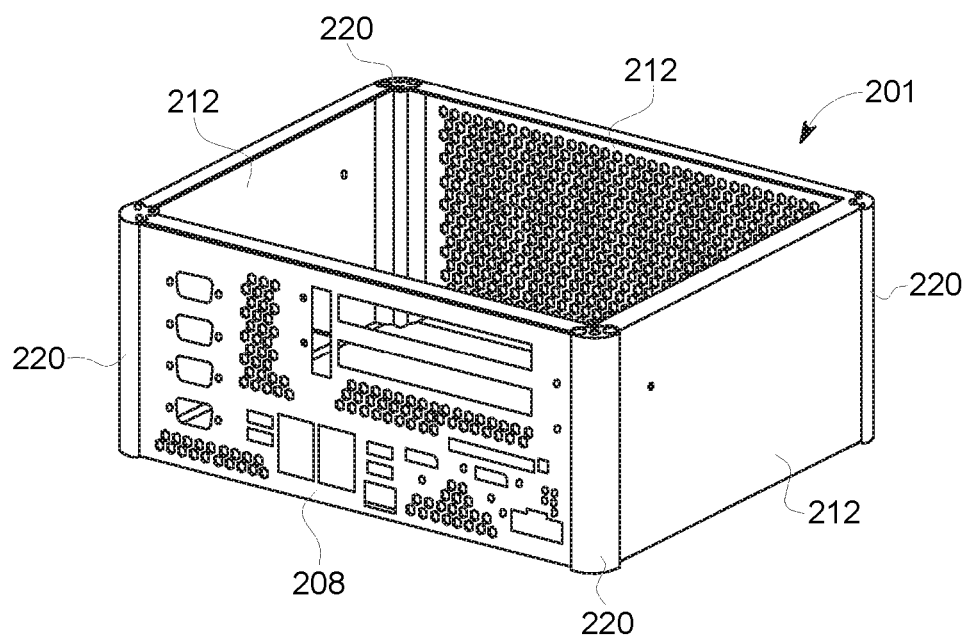
FIG. 2 illustrates an IPC housing incorporating features of the present disclosure.

FIG. 2 shows an example of an electronic housing 201 according to principles of the present disclosure. As illustrated, the housing includes sidewalls 212 held in place with respect to one another by profiles 220, which may be at the corner and referred to herein as "corner profiles" when located at the corner region of the housing. One of the sidewalls 212 may be a front panel 208, and the housing 201 may include a sidewall 212 in place of such a front panel 208.

The principles of the present disclosure are described herein in relation to mitigating EMI and improving EMC in an electronics housing at the interaction of a profile or corner profile and at least one sidewall of the housing.

Figure 3:
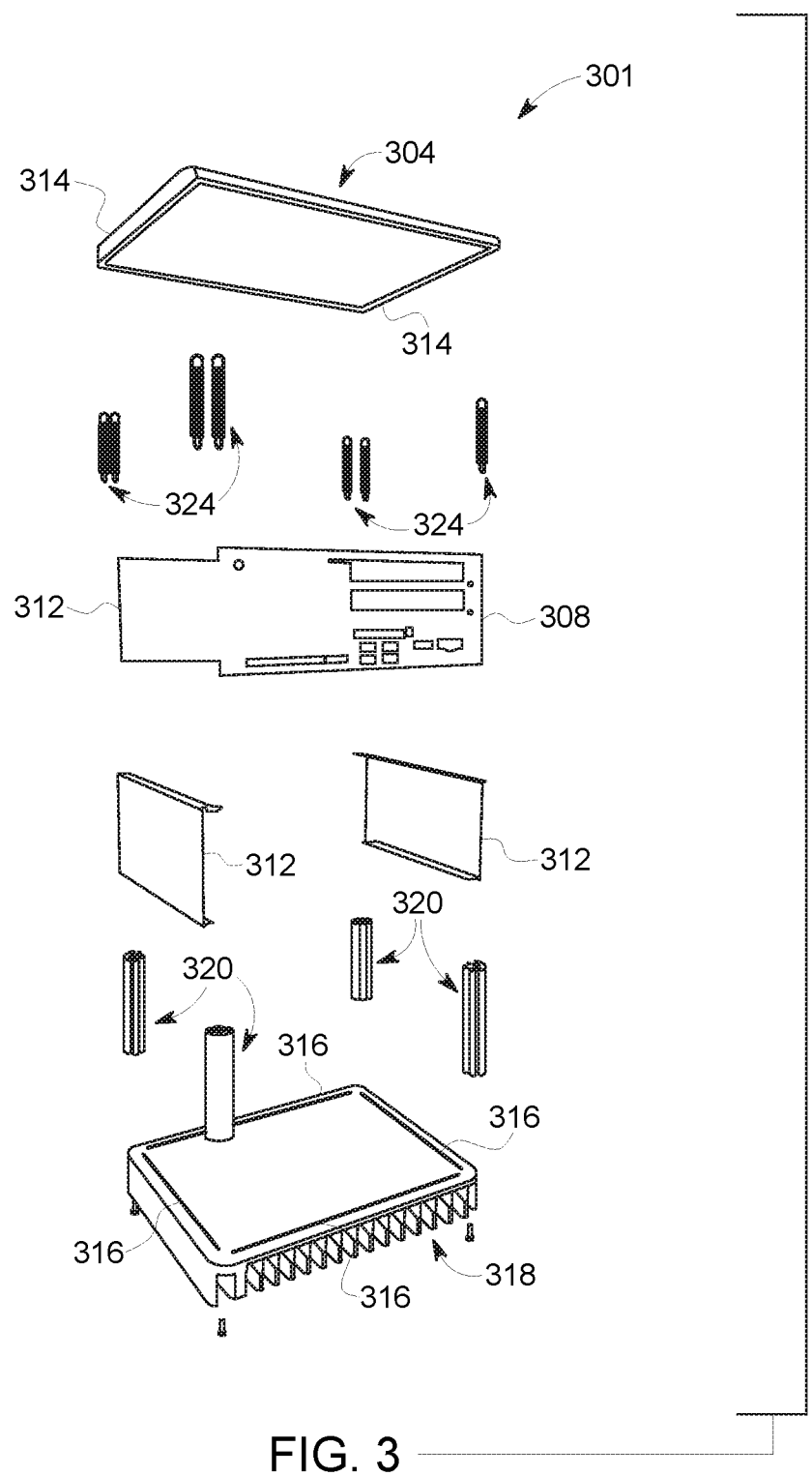
FIG. 3 is an exploded view of an IPC housing illustrating aspects of the present disclosure.

For purposes of describing features of the present disclosure, a disassembled housing 301 of an industrial PC is illustrated in FIG. 3. As illustrated, the housing 301 includes a cover 304, which may be made of die-casted Aluminum, but is not so limited. The cover 304 may also be powder coated, but is not so limited. The housing 301 further includes a front panel 308 and sidewalls 312, which may be made of brushed stainless steel sheet metal or the like, but are not so limited. In this illustration, the sidewalls 312 and the front panel 308 are inserted into slots 314 formed in an underside of the cover 304 and slots 316 in a base 318, which may be a heat sink. The presently described housing is that it is modular, and therefore the wall panel, the cover and the base are independent of one another, as compared to the previously known unitary wall structure formed by extrusion.

According to principles of the present disclosure, referring to FIG. 3, the base 318 may be extrusion casted and may be colorlessly chromated inside and glass bead blasted outside and colorlessly anodized on the outside, but is not so limited. Profiles 320, which will be described in more detail herein, are included in the corner regions of the housing and extend from the slots 316 in the base 318 to the slots 314 in the cover 304. The profiles 320 are electrically conductive and stiff, and may be made of, for example, extruded Aluminum or other material of similar properties. The profiles 320 may be made of a non-conductive or insulating material and plated to provide electrical conductivity. That is, the profile 320 may have an electrically conductive surface, or at least a portion of the surface of the profile may be electrically conductive. An insert 324, which will described in more detail herein, extends through the profiles 320. As illustrated in FIG. 3, the inserts 324 are metal springs, and may be otherwise formed, as described later herein.

While described herein in relation to a cover and a base, the present disclosure is not limited to use with a base and cover and four sidewalls. For example, the housing 301 does not require slots 314 and 316. That is, a profile with an integrated insert, where the insert provides a spring force to cause two components of the housing to be pressed together to make electrical contact for the dissipation of EMI, is provided by this disclosure. For example, the insert may be spring-biased radially outward. The insert may extend the entire length or only part of the entire length of the profile.

Figure 4A:
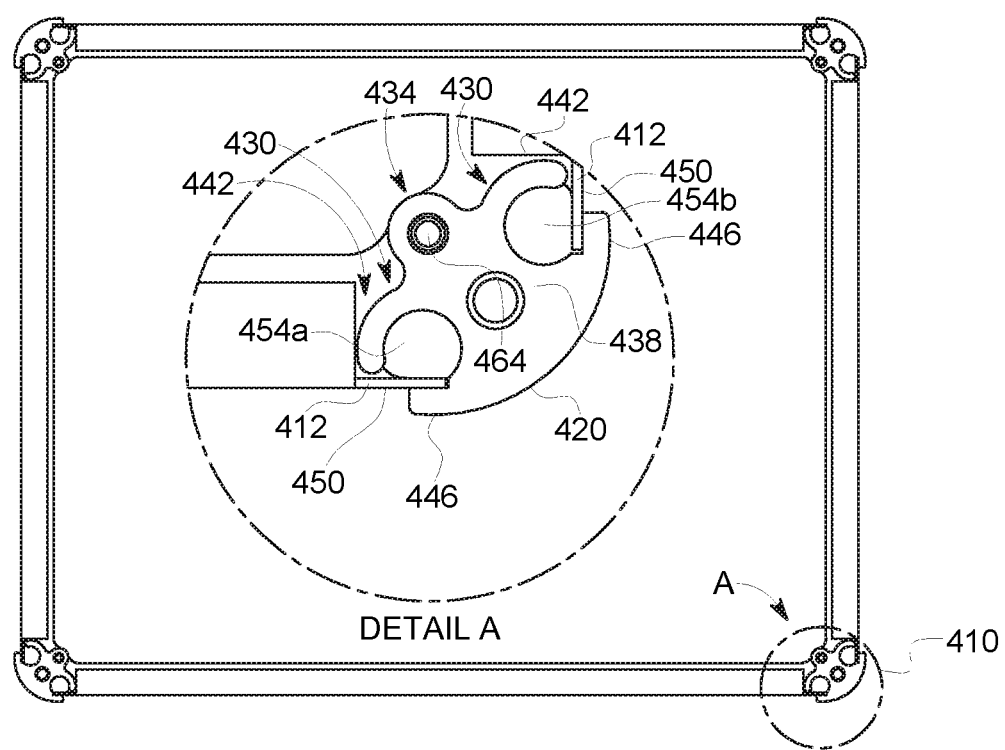
FIG. 4A is a top view/cross-section illustration of an electronics housing and detail of a corner region of an IPC incorporating aspects of the present disclosure.
Figure 4B:
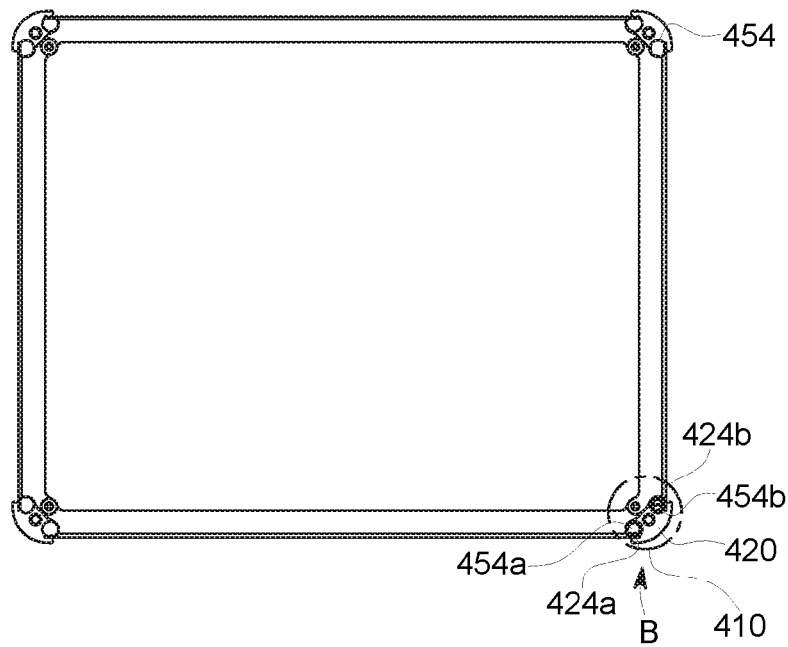
FIG. 4B is a top view/cross-section illustration of an electronics housing of an IPC incorporating aspects of the present disclosure.
Figure 4C:
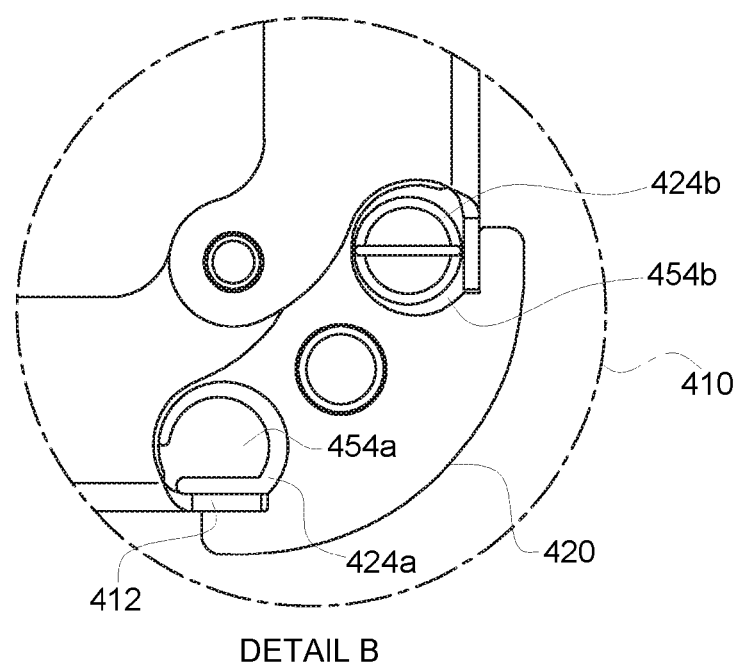
FIG. 4C is a top view/cross-section illustration of detail of a corner region of an IPC incorporating aspects of the present disclosure.

FIG. 4A illustrates an exemplary the profile 420 in cross section and as provided in the corner region 410 of an exemplary housing 401. As illustrated in FIG. 4, the profile 420 includes at least two proximal walls 430 extending from a central region 438 of the profile 420 to an end region 442 of a sidewall 412 or front panel (not shown). The profile 420 includes at least two distal walls 446 extending from the central region 438 of the profile 420 to an exterior region 450 of a sidewall 412 or front panel (not shown). The profile further includes gaps or recesses 454a and 454b between respective proximal walls 430 and distal walls 446. A portion of the sidewall 412 extends into the gap or recess 454a, 454b. Referring to FIGS. 3 and 4A-C, the insert 324 extends through at least a portion of the recess 454 in the profile 320 in a direction from the base 318 to the cover 304 or vice versa. While two gaps or recesses 454a, 454b are illustrated, the profile 420 may be configured with only one recess 454 to accommodate only one sidewall 412 if only one sidewall 412 is employed.

FIG. 4B is a top view/cross-section illustration of an electronics housing 401 of an IPC incorporating aspects of the present disclosure, including an insert 424a, 424b in the recess or gap 454a, 454b FIG. 4C is a top view/cross-section illustration of detail of a corner region of an IPC incorporating aspects of the present disclosure. The insert 424 exerts a spring force on the profile 420 and the sidewall 412 such that the sidewall 412 is pressed against the profile 420 to cause an electrical contact. An exemplary spring force is denoted in FIG. 4A by the double headed arrow in the recess 454a. At least a portion of the inner surface of recess 454 is electrically conductive, which may be produced by plating at least a portion of the wall of the gap or recess 454. Most or all of the inner surface of the recess 454 may be electrically conductive. The sidewall 412 is also at least partially electrically conductive.

The contact area for spring or insert 424 and sidewalls 412 may be electrically conductive. The spring or insert 424 may be made of an electrically conductive material, such as extruded Aluminum. In addition, the spring or insert may be made of a non-conductive material that is coated or plated with electrically conductive material. While illustrated in FIG. 4A-C as having a curved or rounded topology, the corner profile 420 is not limited to the curved or rounded profile. The curved profile may result for extrusion casting and facilitate manufacture of the profile. The profile may also be used in regions that are not at the corner of the housing, for instance, to create a sidewall having multiple panels held next to each other by the profile.

Figure 5A:
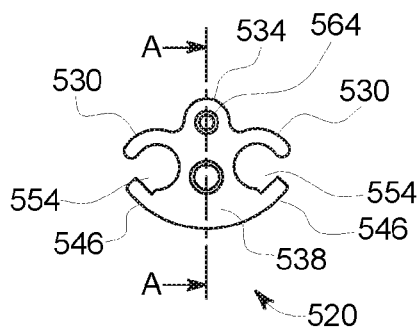
FIG. 5A illustrates an exemplary profile in cross-section.
Figure 5B:
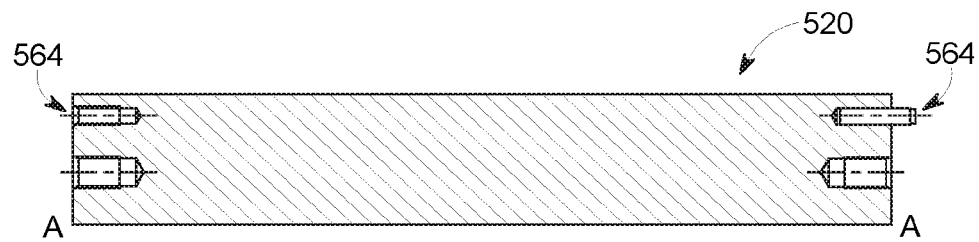
FIG. 5B illustrates an exemplary profile in cross-section along line A-A of FIG. 5B.
Figure 5C:
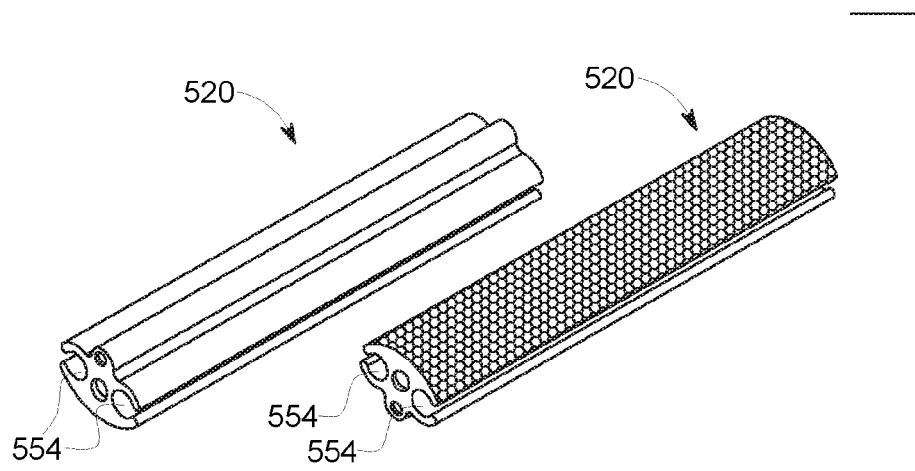
FIG. 5C illustrates a perspective view of the exemplary profile.
Figure 6:
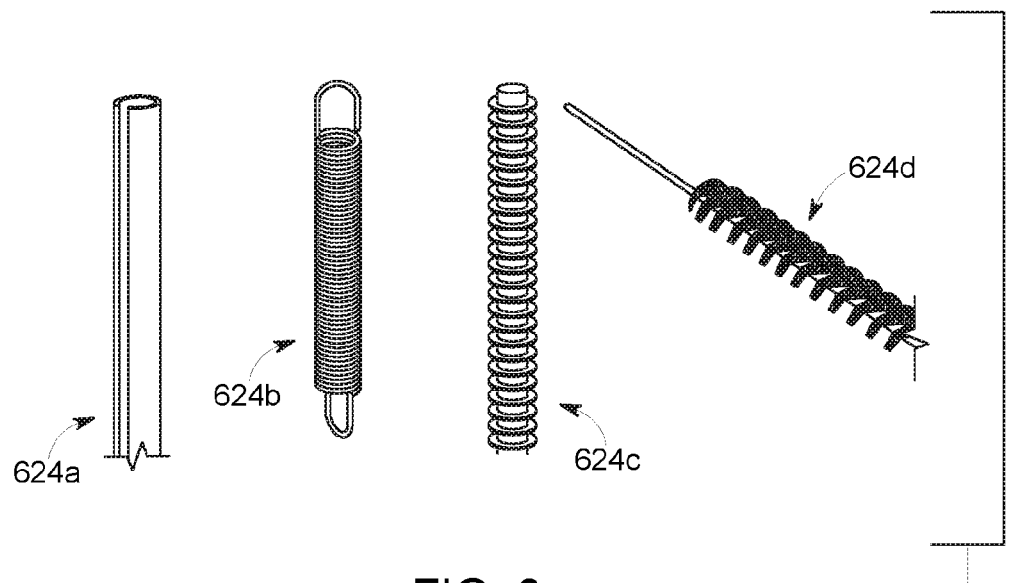
FIG. 6 illustrates an exemplary insert according to principles of the present disclosure.

FIG. 5A illustrates the exemplary profile in cross-section. FIG. 5B illustrates the exemplary profile in cross-section along line A-A of FIG. 5B. FIG. 5C a perspective view of the profile. FIGS. 5A and 5B illustrate a profile 520 includes at least two proximal walls 530 and two distal walls 546e extending from a central region 538 of the profile 420, and recesses or gaps 554. FIGS. 5A and 5B further illustrate screw hole 564, which may further be included in the profile for attaching the sidewalls (not shown) to one another or to the profile 520 itself Possible elements for use as an insert according to principles of the present disclosure are illustrated in FIG. 6. For example, the insert 624 may be an extruded metal or plastic profile 624a, a draw spring 624b, a die-casted insert 624c with a plurality of grooves, a pipe cleaner 624d, or the like. Regardless of the configuration of the insert, the insert may also be electrically conductive or coated to be electrically conductive, as described above. EMC may be achieved by a non-conductive insert if the insert presses the wall against the profile with a force to establish contact for EMI dissipation. The exemplary inserts 624a, 624b, 624c, 624d or the like, may be selected according to the specific needs for a specific product. The draw spring 624b, for example, provides electrical contact at at least three different places (spring to profile, spring to wall and wall to profile (not shown)). A plastic part such as insert 624a can be metalized to function the same way. Also a pipe cleaner 624d can function as a possible "spring". The springs does not need to be electrically conductive to serve the purpose of the present disclosure if they serve to apply pressure between the side walls and the electrical conductive recess area of the corner profile to dissipate EMI. Referring again to FIG. 4C, a "C-shaped" spring 424a having an outwardly biased spring force is illustrated in recess 454a and a coil spring 424b is illustrated in recess 454b. As noted, an object that imparts an outwardly biased spring force may be provided in the recess 454 to serve the purpose of pressing the walls of the housing according to aspects of the present disclosure.

Figure 7:
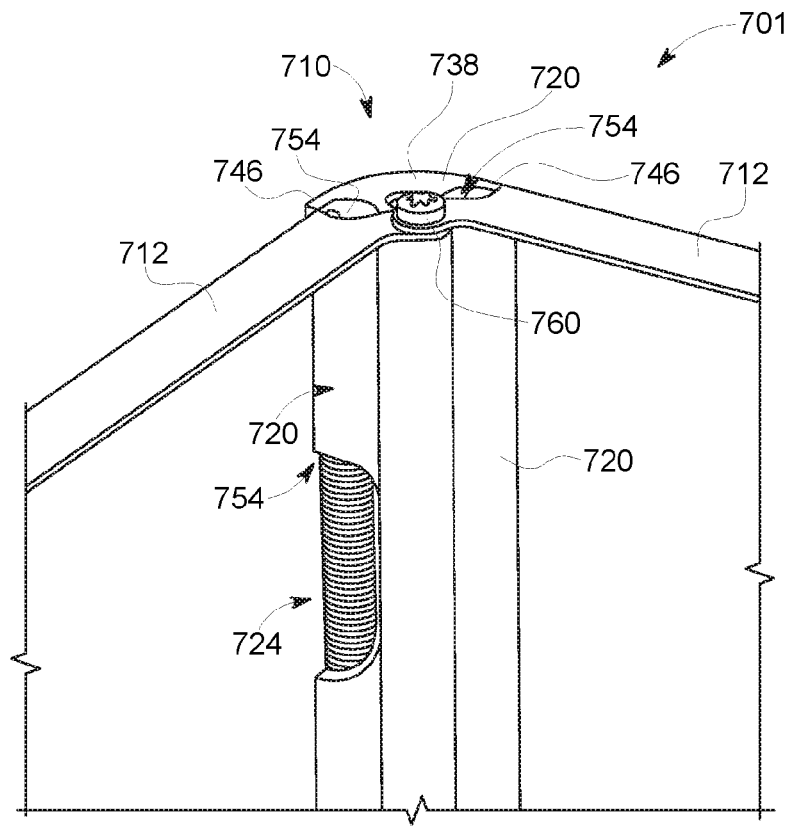
FIG. 7 illustrates an exemplary housing of the present disclosure in an assembled form.

FIG. 7 illustrate an exemplary housing 701 according to principles of the present disclosure in an assembled form. Referring to FIG. 7, a corner region 710 is illustrated in perspective and cut-away. FIG. 7 shows two sidewalls 712 affixed together by screw 760. The screw 760 itself is also received in the profile 720 via a recess, bore hole or threaded or tapered hole (obscured by screw 760), shown in FIG. 4A by reference numeral 464.

An aspect of the present housing includes integration of insert into a profile of the housing build space; the usage of the insert to mount/fix the wall in the profile and to the profile; the electrical contact by the insert/spring on multiple places at the cross section.

Figure 8A:
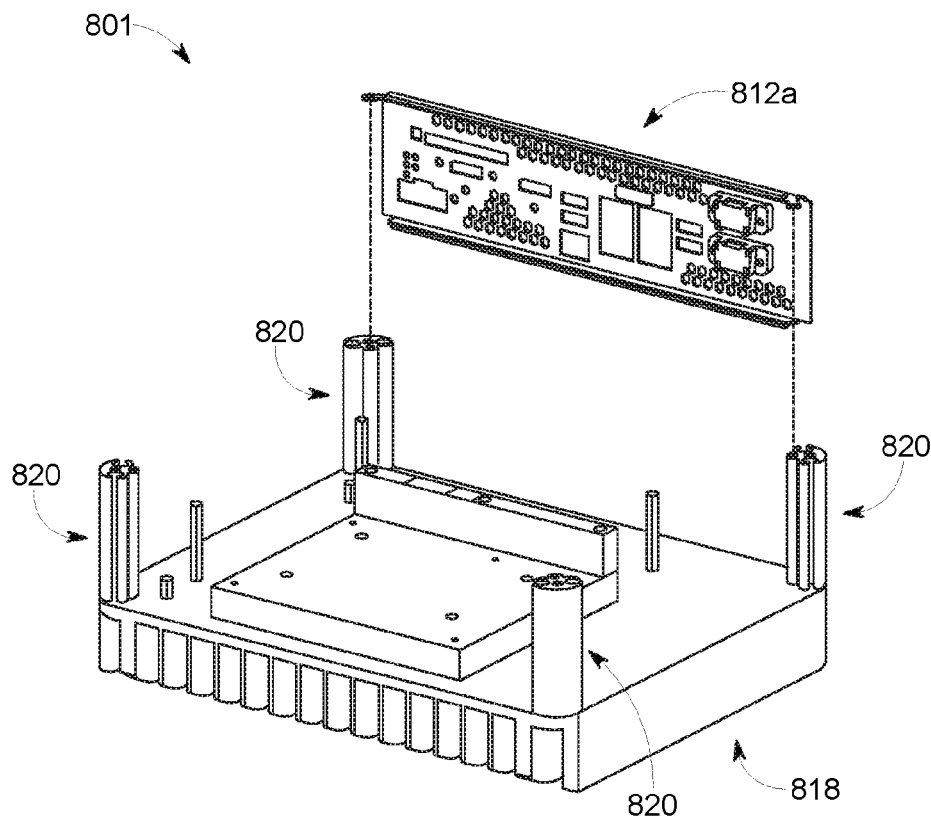
FIGS. 8A-8I illustrate an exemplary assembly of an IPC according to principles of the present disclosure.
Figure 8B:
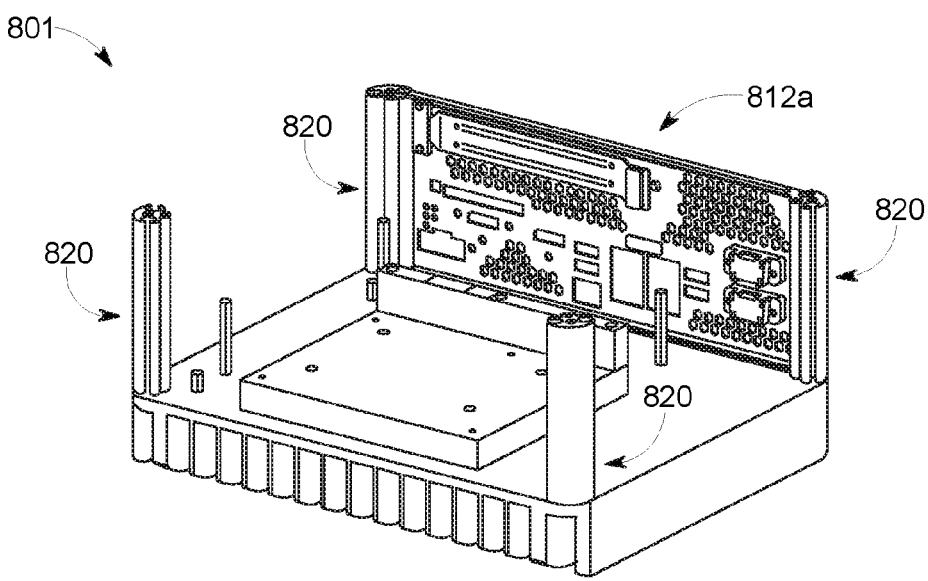

An exemplary assembly of an IPC housing 801 according to principles of the present disclosure are illustrated with respect to FIGS. 8A-8I. FIG. 8A illustrates a base 818 with corner profiles 820 extending therefrom. A first panel 812a, which may be a front, side or rear wall, is provided between two of the corner profiles 820. FIG. 8B illustrates the panel of FIG. 8A in its assembled location between the two corner profiles 820.

Figure 8C:
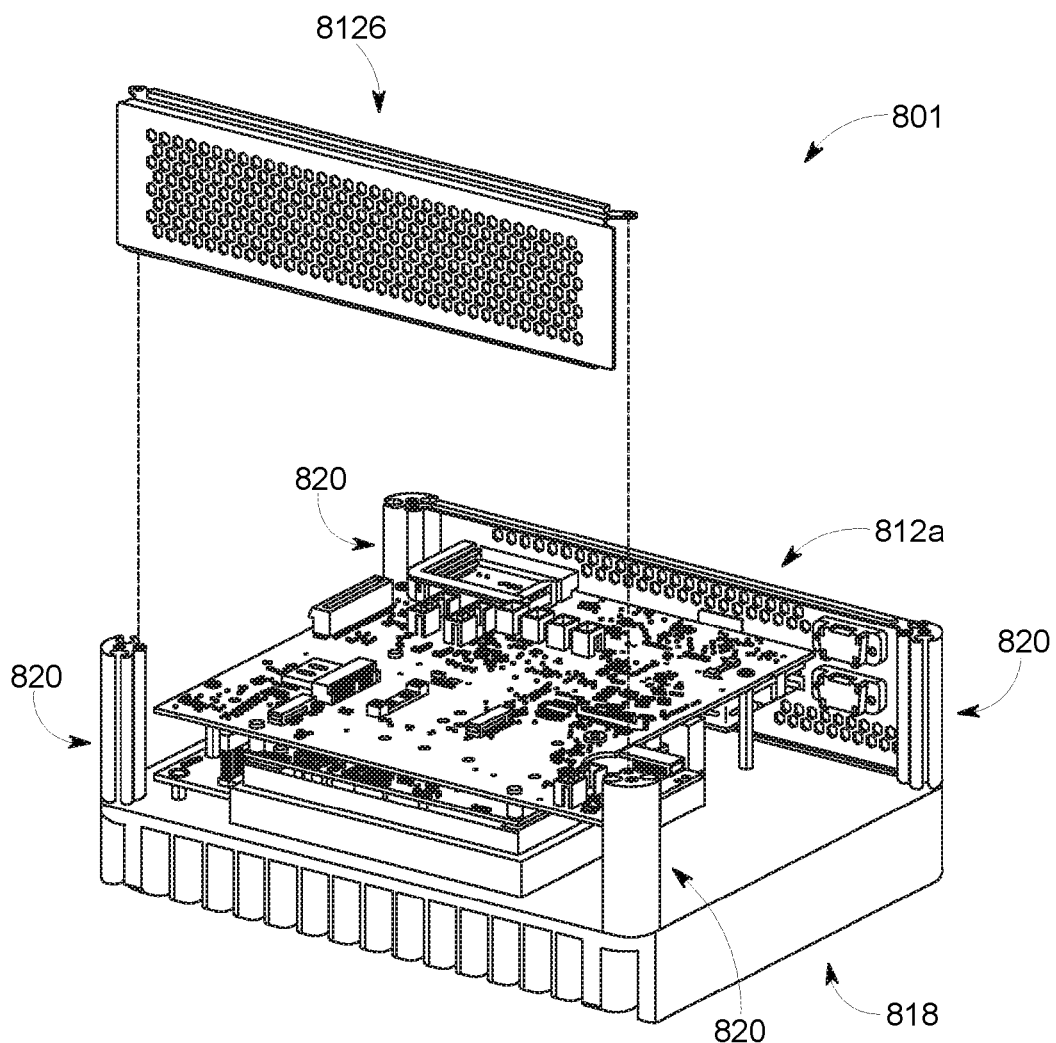
Figure 8D:
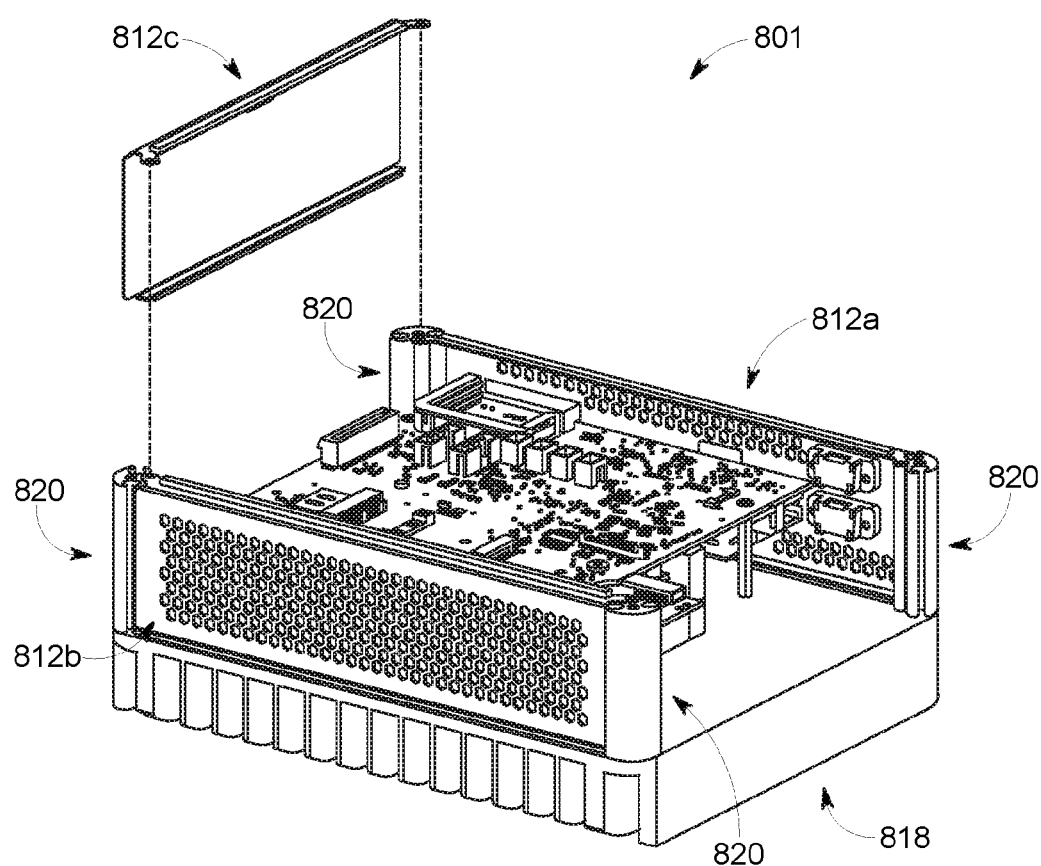

FIGS. 8C and 8D illustrate the assembly of a second panel 812b opposite the first panel 812a illustrated in FIGS. 8A and 8B. FIG. 8C illustrates the base 818 with corner profiles 820 extending therefrom and first panel 812a. The second panel 812b is provided between two of the corner profiles. FIG. 8D illustrates the first panel 812a and the second panel 812b in their assembled locations between two corner profiles 820.

Figure 8E:
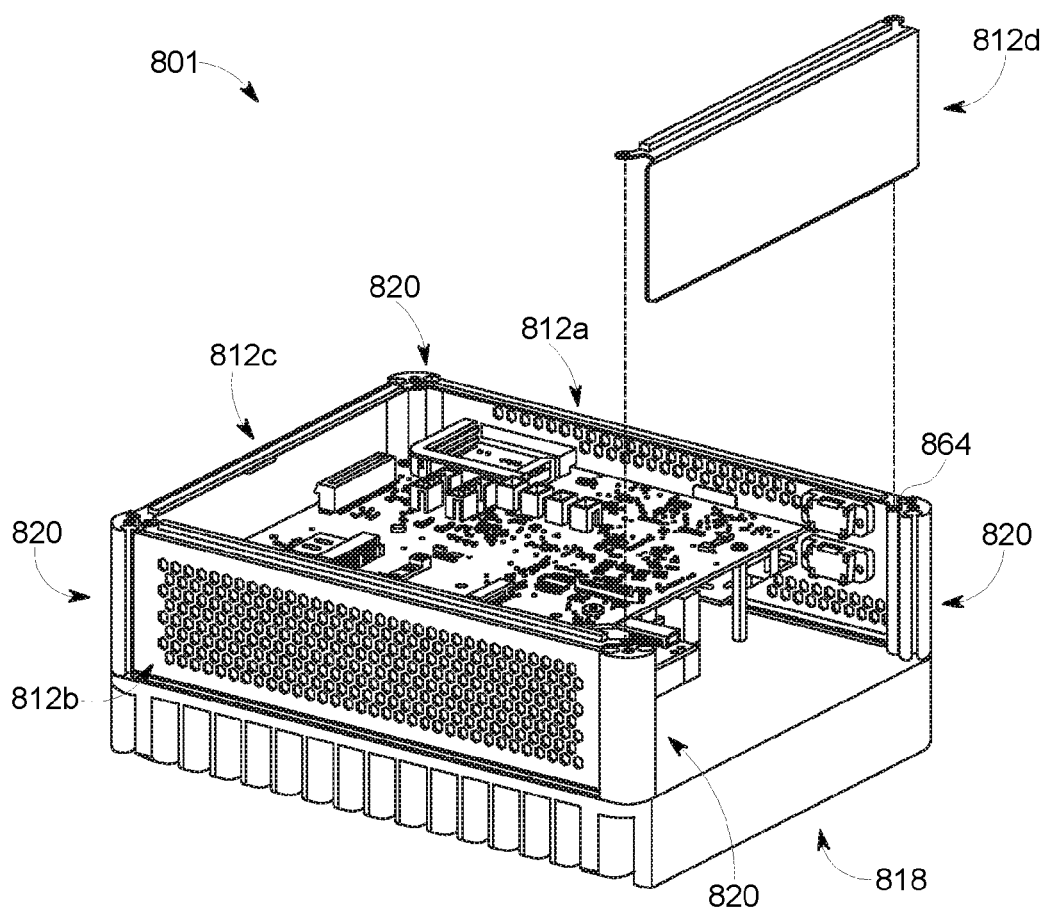

FIG. 8D also illustrates the introduction of a third panel 812c between the first panel 812a and the second panel 812b. The third panel 812c is provided between two of the corner profiles 820. FIG. 8E illustrates the third panel 812c in its assembled location and also illustrates the introduction of a fourth panel 812d between the first panel 812a and the second panel 812b. The fourth panel 812d is provided between two of the corner profiles 820.

Figure 8F:
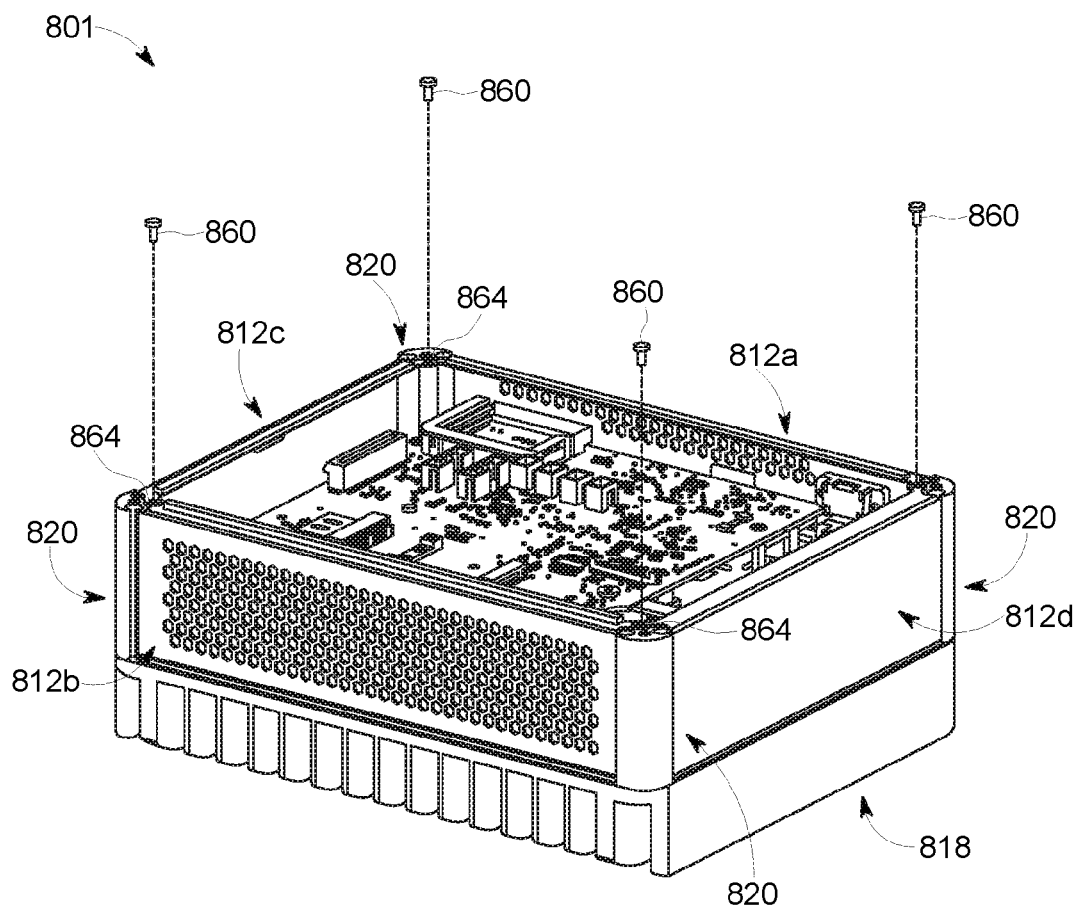

FIG. 8E illustrates the assembly with the side panels 812a-d in assembled locations. After the side panels 812a-d are slid into the corner profiles 820, the side walls 812a-d may be attached or fixed in their locations by the introduction of a fastener, such as a screw 860, into a hole provided in the profile to hold the panels and in their configuration, as illustrated in FIG. 8F. In the example of FIG. 8A-F, the housing configuration is a box or rectangular. The principles of the present disclosure apply to other configurations where two walls are to be held in place with respect to one another.

Figure 8G:
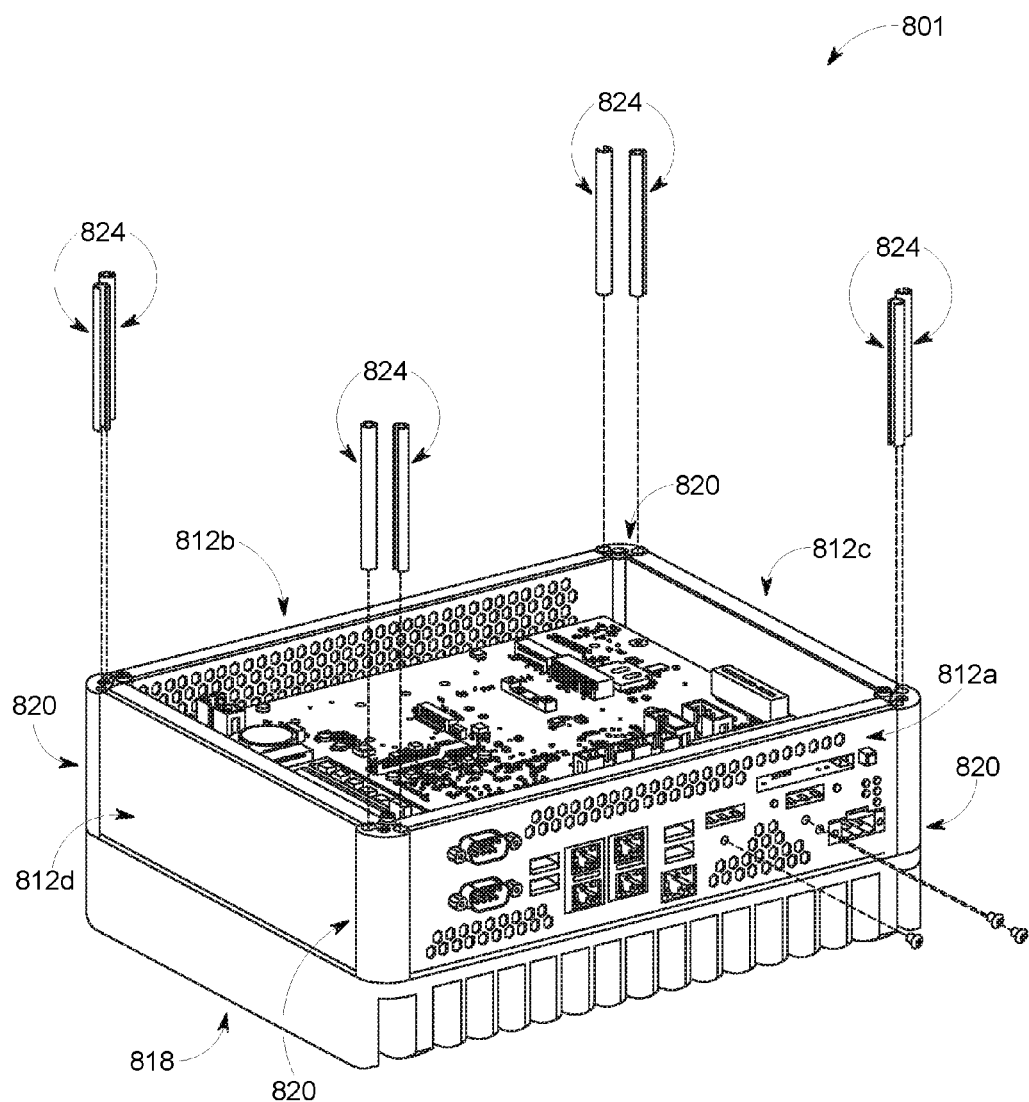
Figure 8H:
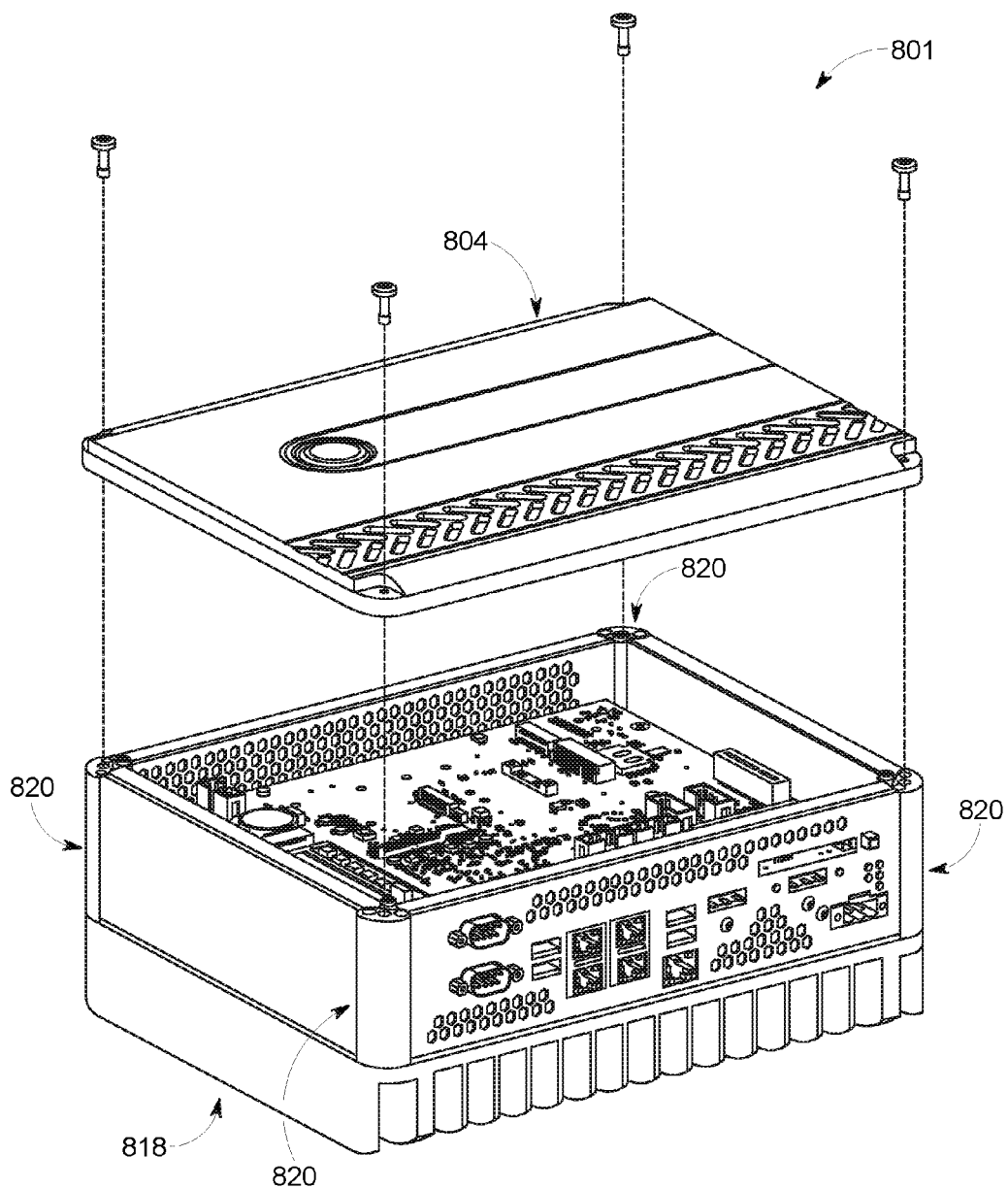
Figure 8I:
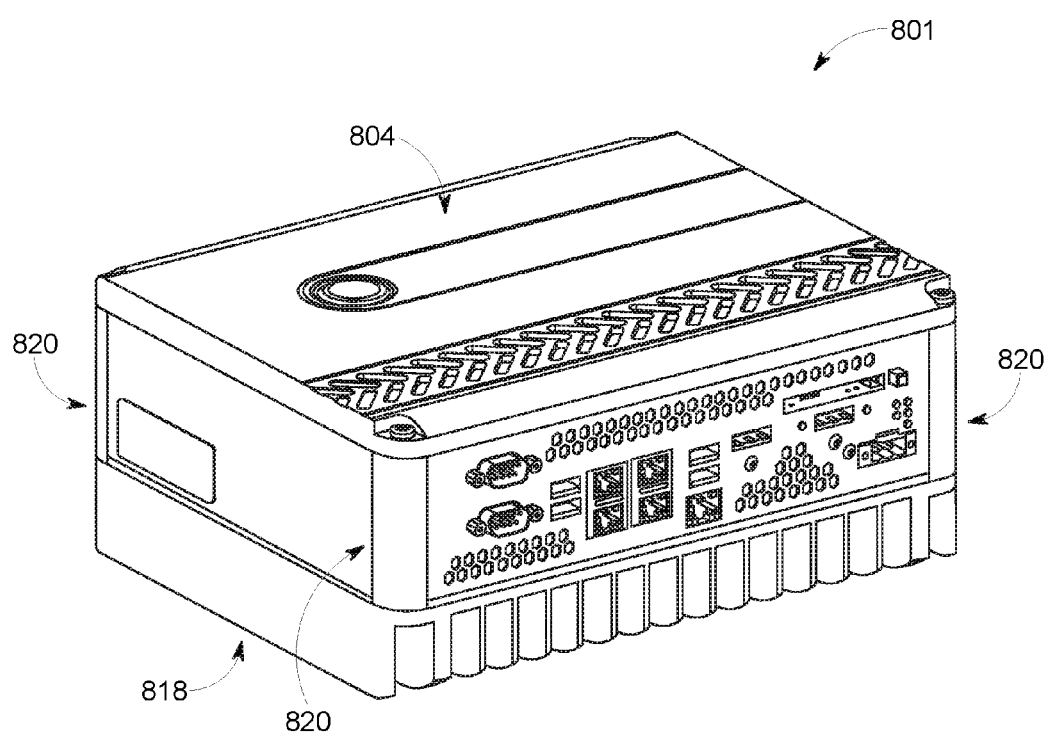

FIG. 8G shows the introduction of inserts 824 according to principles of the present disclosure into recess of the corner profiles 820. As illustrated, the inserts have a "C" shaped cross-section that imparts an outward force to press together the sidewalls 812a-d and the base 818. FIG. 8H illustrates the installation of a top cover 804, which may be affixed to the assembly by the application of screws through the cover 804 to a predetermined location in at least one of the profiles 820. FIG. 8I illustrates a fully assembled IPC housing 801 according to principles of the present disclosure.

While various aspects of the present disclosure have been described above, it should be understood that they have been presented by way of example only, and not limitation. It will be apparent to persons skilled in the relevant art that various changes in form and detail can be made therein without departing from the spirit and scope of the present disclosure. Thus, the breadth and scope of the present disclosure should not be limited by any of the above-described examples, and should be defined only in accordance with the following claims and their equivalents.

What is claimed is:
1. A housing, comprising:
a first sidewall;
a profile having at least one recess extending there through, wherein a portion of the first sidewall extends into the recess;
a second sidewall, wherein the first sidewall is adjacent to the second sidewall; and
an insert in the recess and extending in a direction of the recess, a portion of the insert in contact with the profile and the portion of the first sidewall in the recess.

2. The housing according to claim 1, wherein the insert has a spring-bias to exert force on the portion of the first sidewall in the recess.

3. The housing according to claim 2, wherein the spring-bias is radially outward.

4. The housing according to claim 1, wherein the insert is electrically conductive.

5. The housing according to claim 1, wherein the insert comprises a metal spring.

6. The housing of claim 1, wherein a surface of the recess is electrically conductive.

7. The housing according to claim 1, wherein the insert comprises plastic.

8. The housing according to claim 7, where in the insert is die-casted.

9. The housing according to claim 7, wherein the insert is extruded.

10. The housing according to claim 7, wherein the insert has an electrically conductive surface.

11. The housing of claim 7, wherein a surface of the recess is electrically conductive.

12. A housing, comprising:
   a base;
   a profile extending from the base and having a slot therein;
   a wall having an edge in the slot of the profile, wherein at least a portion of the wall is electrically conductive; and
   an insert having a spring bias in the slot adjacent to the wall, the insert pressing the wall to abut the profile, wherein at least a portion of the profile is electrically conductive.

13. The housing according to claim 12, wherein the insert has a radially outward spring-bias.

14. The housing according to claim 12, wherein the insert is electrically conductive.

15. The housing according to claim 12, wherein the insert comprises a metal spring.

16. The housing according to claim 12, wherein the insert comprises plastic.

17. The housing according to claim 16, wherein insert has an electrically conductive surface.

18. The housing of claim 12, wherein a surface of the slot is electrically conductive.

19. The housing of claim 12, wherein the profile is electrically conductive.

20. A method of dissipating EMI in a housing having a first sidewall and a second sidewall, comprising:
   providing a profile;
   sliding the first sidewall into a first slot in the profile;
   sliding the second sidewall into a second slot in the profile; and
   providing an insert having a spring bias, the insert in one of the first slot and second slots of the profile to abut at least a portion of one of the first sidewall and second sidewall and an inner surface of the one of the first slot and the second slot to apply a spring force to the one of the first and second sidewalls to press the one of the first sidewall and second sidewall to abut the profile.

* * * * *